United States Patent
Onfroy

(10) Patent No.: US 9,685,601 B2
(45) Date of Patent: Jun. 20, 2017

(54) METHOD FOR CONTROLLING A PIEZOELECTRIC DEVICE HAVING A PIEZOELECTRIC ELEMENT MOUNTED ON A SUBSTRATE

(71) Applicant: SAFRAN ELECTRONICS & DEFENSE, Boulogne Billancourt (FR)

(72) Inventor: Philippe Onfroy, Boulogne Billancourt (FR)

(73) Assignee: Safran Electronics & Defense, Boulogne-Billancourt (FR)

( * ) Notice: Subject to any disclaimer, the term of this patent is extended or adjusted under 35 U.S.C. 154(b) by 0 days.

(21) Appl. No.: 14/888,350

(22) PCT Filed: Apr. 23, 2014

(86) PCT No.: PCT/EP2014/058282
§ 371 (c)(1),
(2) Date: Oct. 30, 2015

(87) PCT Pub. No.: WO2014/177443
PCT Pub. Date: Nov. 6, 2014

(65) Prior Publication Data
US 2016/0079511 A1    Mar. 17, 2016

(30) Foreign Application Priority Data

Apr. 30, 2013  (FR) .................................. 13 54008

(51) Int. Cl.
*H01L 41/04*   (2006.01)
*H03L 1/02*    (2006.01)
*H01L 41/08*   (2006.01)
*H01L 41/18*   (2006.01)

(52) U.S. Cl.
CPC .......... *H01L 41/042* (2013.01); *H01L 41/081* (2013.01); *H01L 41/18* (2013.01); *H03L 1/026* (2013.01)

(58) Field of Classification Search
CPC ............................. H03H 9/02448; H03H 9/08
USPC ............................. 310/315, 316.01, 317, 346
See application file for complete search history.

(56) References Cited

U.S. PATENT DOCUMENTS

| | | | |
|---|---|---|---|
| 6,234,032 B1* | 5/2001 | Okumoto | G01L 1/08 73/862.68 |
| 2003/0184399 A1 | 10/2003 | Lanoue et al. | |
| 2005/0093638 A1 | 5/2005 | Lin et al. | |
| 2005/0099239 A1 | 5/2005 | Matsuura | |
| 2008/0007363 A1 | 1/2008 | Nagatomo et al. | |

(Continued)

*Primary Examiner* — Shawki S Ismail
*Assistant Examiner* — Bryan Gordon
(74) *Attorney, Agent, or Firm* — Muncy, Geissler, Olds & Lowe, P.C.

(57) ABSTRACT

A method for controlling a piezoelectric device including a piezoelectric element attached to a substrate, with the substrate and the piezoelectric element being made of materials having different coefficients of thermal expansion includes the step of subjecting the piezoelectric element to a predetermined electric voltage in order to cause a predetermined set deformation of the piezoelectric element. The predetermined electric voltage comprises a compensation portion determined according to ambient temperature to cancel a stress generated on the piezoelectric element due to a differential thermal expansion between the piezoelectric element and the substrate.

4 Claims, 1 Drawing Sheet

(56) References Cited

U.S. PATENT DOCUMENTS

| | | | | |
|---|---|---|---|---|
| 2008/0079516 A1* | 4/2008 | Ruby | ............... | H03H 3/04 |
| | | | | 333/189 |
| 2011/0204750 A1* | 8/2011 | Fujii | ............... | H01L 41/094 |
| | | | | 310/330 |
| 2012/0013410 A1 | 1/2012 | Rebel et al. | | |
| 2012/0036917 A1* | 2/2012 | Avramescu | ............... | G01N 29/022 |
| | | | | 73/24.04 |
| 2012/0206014 A1* | 8/2012 | Bibl | ............... | B06B 1/0644 |
| | | | | 310/331 |
| 2012/0249992 A1* | 10/2012 | Matsuura | ............... | H01L 21/68707 |
| | | | | 355/72 |
| 2013/0140156 A1* | 6/2013 | Fujii | ............... | H01L 41/0838 |
| | | | | 200/181 |
| 2013/0221807 A1* | 8/2013 | Shimizu | ............... | H01L 41/0471 |
| | | | | 310/366 |

* cited by examiner

METHOD FOR CONTROLLING A PIEZOELECTRIC DEVICE HAVING A PIEZOELECTRIC ELEMENT MOUNTED ON A SUBSTRATE

BACKGROUND OF THE INVENTION

The present invention relates to a method for controlling a piezoelectric device having a piezoelectric element. Such a device is for example an actuator or a sensor such as an inertial vibrating sensor such as an accelerometer or a gyroscope.

Such devices are known, wherein the piezoelectric element is brazed or glued on a substrate made of a material different from that of the piezoelectric element. When such a device is subjected to temperature changes, the dimensions of the substrate and the vibrating element will change differently according to the respective coefficients of thermal expansion of said materials. This results in differential expansions which cause stresses which may distort the amplitude of the displacements controlled in the case for example of an actuator and the measurements provided by the device when it is a sensor. Such stresses are all the more important as the temperature variations are significant (temperatures may commonly vary from −40° C. to +90° C. for example).

Such differential expansions also produce constraints liable to affect the binder layer connecting the piezoelectric element to the substrate.

BRIEF SUMMARY OF THE INVENTION

An object of the invention is to overcome the above drawbacks.

For this purpose there is provided according to the invention a method for controlling a piezoelectric device having a piezoelectric element fixed to a substrate, with the substrate and the piezoelectric element being made of materials having different coefficients of thermal expansion. The method comprises the step of subjecting the piezoelectric element to an electric voltage so determined as to cause a set deformation of the piezoelectric element and the determined electric voltage comprises a compensation portion determined according to ambient temperature to cancel a stress generated on the vibrating member due to a differential thermal expansion between the vibrating element and the substrate.

Thus, the compensation portion of the control voltage causes a deformation of the piezoelectric element so as to cancel the differential expansion: for example, if the substrate is subjected, under the effect of temperature, to a greater elongation than the piezoelectric element, the compensation portion is so determined as to cause a further elongation of the piezoelectric element such that the substrate and the piezoelectric element have identical expansions. Another advantage lies in that it provides more opportunities in the choice of the substrate material, with the coefficient of thermal expansion of the material being possibly overlooked in the selection criteria.

The invention also relates to a piezoelectric device for implementing this method.

Other characteristics and advantages of the invention will become apparent from reading the following description of a particular non-restrictive embodiment of the invention.

BRIEF DESCRIPTION OF THE SEVERAL VIEWS OF THE DRAWING(S)

Reference is made to the appended drawings, wherein.

DETAILED DESCRIPTION OF THE INVENTION

Figure 1:
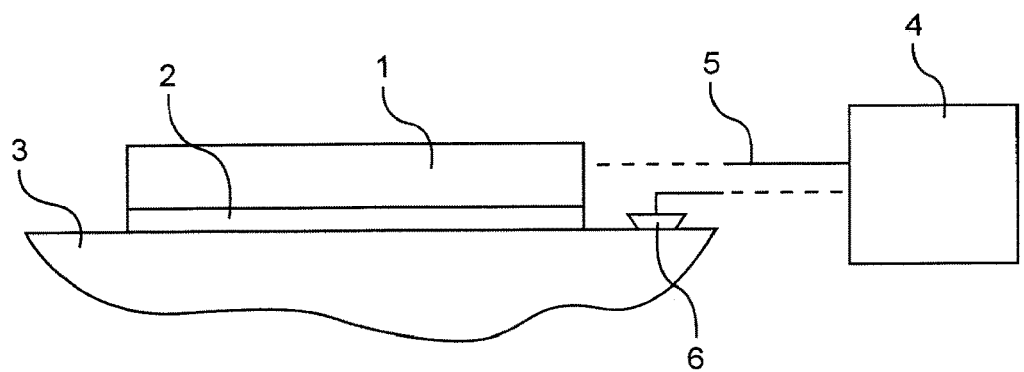
FIG. 1 is a schematic view of a device according to the invention.

With reference to the figures, the device according to the invention comprises a piezoelectric element 1 mounted on a substrate 2 by means of an adhesive layer 3. The piezoelectric element 1 and the substrate 2 are made of materials having different coefficients of expansion. In a manner known per se, the piezoelectric element 1 is connected to a control unit 4 by means of an energizing circuit 5.

The control unit 4 is so arranged as to implement the control method according to the invention.

The method comprises the step of subjecting the piezoelectric element 1 to an electric voltage so determined as to cause a non-continuous deformation of the piezoelectric element.

Figure 2:
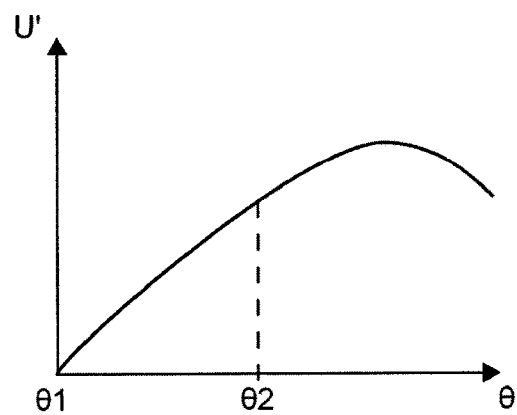
FIG. 2 is a diagram showing the compensation portion U' of the control voltage u as according to the temperature Θ.
Figure 3:
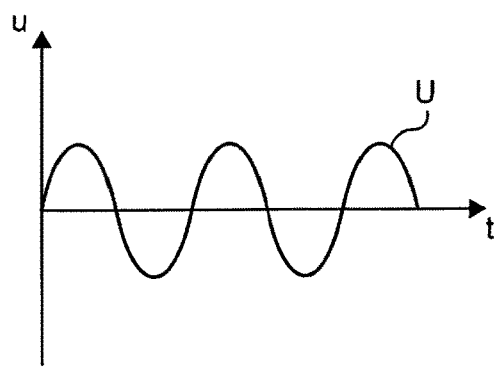
FIG. 3 is a diagram showing the control voltage u as a function of time t, at a temperature Θ1.
Figure 4:
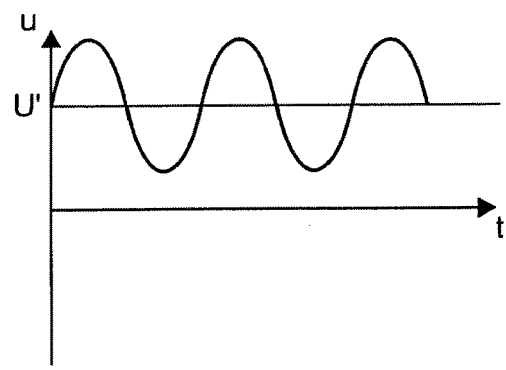
FIG. 4 is a diagram showing the control voltage u as a function of time t, at a temperature Θ2.

Referring more particularly to FIGS. 2 to 4, the determined electric voltage u comprises a compensation portion U' determined according to ambient temperature Θ to cancel a stress generated on the piezoelectric element 1 due to a differential thermal expansion between the piezoelectric element 1 and the substrate 2. Ambient temperature means a temperature in the vicinity of the piezoelectric element 1 and of the substrate 2.

FIG. 2 shows an example of the values of the compensation portion U' according to the ambient temperature Θ. For a given temperature Θ1 or Θ2, the compensation portion U' here is a continuous value (see FIGS. 3 and 4). The U=u−U' difference corresponds to the voltage required to obtain the set deformation in the absence of a differential expansion.

In the example described here, in FIG. 3, the temperature Θ1 corresponds to the manufacturing temperature of the device so that the assembly composed of the piezoelectric element 1, the substrate 2 and the adhesive layer 3 undergoes no differential expansion: the compensation portion U' corresponds to a zero value.

On the contrary, in FIG. 4, the temperature Θ2 is higher than the manufacturing temperature of the device so that the assembly composed of the piezoelectric element device 1, the substrate 2 and the adhesive layer 3 undergoes no differential expansion: the compensation portion U' thus corresponds to a non-zero value.

For implementing the method of the invention, the ambient temperature Θ is periodically measured and the compensation portion U' is periodically determined using a table that is stored in the control unit 4 and which relates ambient temperature Θ values with compensation portion U' values. This table has for example been determined by tests conducted at the factory or by a computer simulation based on the expected ambient temperatures in the considered application and the differential thermal expansions computed from the coefficients of thermal expansion of the various materials.

For measuring the ambient temperature, the device advantageously comprises a temperature sensor 6 fixed to the substrate 2 in the vicinity of the piezoelectric element 1.

Of course, the invention is not limited to the described embodiments but encompasses any alternative solution within the scope of the invention as defined in the claims.

In particular, the method of the invention can be implemented without measuring the ambient temperature but from other data which the ambient temperature depends on. For example, for a device aboard a vehicle, the ambient temperature can be deduced or estimated from the temperature outside the vehicle or from vehicle location data associated with timestamping data. When the vehicle is an aircraft, the ambient temperature can be deduced or estimated from the altitude which the aircraft is flying at.

Instead of using a table, the control voltage compensation portion can be calculated in real time from the ambient temperature in the considered application and the differential thermal expansions themselves as computed from the coefficients of thermal expansion of the various materials.

In the described embodiment, the ambient temperature $\Theta$ is periodically measured and the compensation portion U' is periodically determined according to the measured ambient temperature $\Theta$. In an alternative solution, it is possible, if the temperature which the device is used at is substantially constant while being different from the temperature which the device is manufactured at, to determine, prior to the utilization, the expected ambient temperature in use and a compensation portion to cancel the differential expansions, with such compensation portion being constant and systematically applied as from the operation of the device.

The invention claimed is:

1. A method for controlling a piezoelectric device comprising a piezoelectric element fixed on a substrate, with the substrate and the piezoelectric element being made of materials having different coefficients of thermal expansion, with the method comprising the step of subjecting the piezoelectric element to a predetermined electric voltage to cause a predetermined set deformation of the piezoelectric element, wherein the predetermined electric voltage comprises a compensation portion determined according to ambient temperature to cancel a stress generated on the piezoelectric element due to a differential thermal expansion between the piezoelectric element and the substrate.

2. The method according to claim 1, wherein the ambient temperature is periodically measured and the compensation portion is periodically determined.

3. The method according to claim 1, wherein the compensation portion is determined using a table relating ambient temperature values with compensation portion values.

4. A piezoelectric device comprising a piezoelectric element fixed on a substrate, with the substrate and the piezoelectric element being made of materials having different coefficients of thermal expansion, with the device comprising a control unit which is connected to an energizing circuit of the piezoelectric element and which is so arranged as to implement the method according to claim 1.

* * * * *